United States Patent
Hori et al.

(10) Patent No.: US 9,395,394 B2
(45) Date of Patent: Jul. 19, 2016

(54) VOLTAGE MEASURING CIRCUIT AND METHOD

(75) Inventors: Yuki Hori, Sagamihara (JP); Shin Suzuki, Sagamihara (JP)

(73) Assignee: NEC ENERGY DEVICES, LTD., Kanagawa (JP)

( * ) Notice: Subject to any disclaimer, the term of this patent is extended or adjusted under 35 U.S.C. 154(b) by 918 days.

(21) Appl. No.: 13/697,964

(22) PCT Filed: Jul. 1, 2011

(86) PCT No.: PCT/JP2011/065178
§ 371 (c)(1),
(2), (4) Date: Nov. 14, 2012

(87) PCT Pub. No.: WO2012/005186
PCT Pub. Date: Jan. 12, 2012

(65) Prior Publication Data
US 2013/0066575 A1    Mar. 14, 2013

(30) Foreign Application Priority Data

Jul. 7, 2010   (JP) .................................. 2010-154610

(51) Int. Cl.
| | |
|---|---|
| *G06F 17/40* | (2006.01) |
| *G06F 19/00* | (2011.01) |
| *G01R 15/22* | (2006.01) |
| *G01R 19/00* | (2006.01) |

(Continued)

(52) U.S. Cl.
CPC ............. *G01R 15/22* (2013.01); *B60L 11/1859* (2013.01); *G01R 19/0084* (2013.01); *G01R 31/3624* (2013.01); *B60L 2240/547* (2013.01); *G01R 31/361* (2013.01); *G06F 17/40* (2013.01); *G06F 19/00* (2013.01); *Y02T 10/7005* (2013.01); *Y02T 10/705* (2013.01); *Y02T 10/7011* (2013.01)

(58) Field of Classification Search
None
See application file for complete search history.

(56) References Cited

U.S. PATENT DOCUMENTS 3,082,374 A  * 3/1963  Buuck .................... F41G 7/005
                                                    324/73.1
4,965,512 A    10/1990  Debar et al.

(Continued)

FOREIGN PATENT DOCUMENTS

| CN | 1077032 A | 10/1993 |
|---|---|---|
| CN | 1766658 A | 5/2006 |

(Continued)

OTHER PUBLICATIONS

Office Action dated May 14, 2014, issued by The State Intellectual Property Office of the People's Republic of China, in counterpart Application No. 201180033631.8.

(Continued)

*Primary Examiner* — Edward Cosimano
(74) *Attorney, Agent, or Firm* — Sughrue Mion, PLLC

(57) ABSTRACT

An average current value that is the average value of current values is found by connecting a detection resistor in parallel to two terminals that are the object of measurement, measuring the current value that flows in the detection resistor, and subjecting the current value to time-quadrature, and further, dividing the current value that follows integration by the integration time. The average current value is converted to a digital signal and sent to an arithmetic means (processor). The arithmetic means calculates the voltage value across the two terminals from the average current value and the resistance value of the detection resistor.

12 Claims, 1 Drawing Sheet

(51) Int. Cl.
 *G01R 31/36* (2006.01)
 *B60L 11/18* (2006.01)

(56) References Cited

U.S. PATENT DOCUMENTS

| | | | | |
|---|---|---|---|---|
| 5,672,951 | A | * 9/1997 | Shiota | G01R 31/361 320/132 |
| 5,889,387 | A | * 3/1999 | Massie | H02J 7/0093 320/145 |
| 6,362,627 | B1 | 3/2002 | Shimamoto et al. | |
| 2009/0058423 | A1 | 3/2009 | Abe | |
| 2012/0249075 | A1 | * 10/2012 | Hori | H01M 10/052 320/118 |

FOREIGN PATENT DOCUMENTS

| | | | |
|---|---|---|---|
| CN | 2844928 Y | | 12/2006 |
| CN | 101377541 A | | 3/2009 |
| CN | 101509960 A | | 8/2009 |
| EP | 0853365 A1 | * | 7/1998 |
| JP | 02-135871 U | | 11/1990 |
| JP | 03-138570 A | | 6/1991 |
| JP | 09-281161 A | | 10/1997 |
| JP | 11-125649 A | | 5/1999 |
| JP | 11-248755 A | | 9/1999 |
| JP | 2000-184609 A | | 6/2000 |
| JP | 2001-124805 A | | 5/2001 |
| JP | 2002-189066 A | * | 7/2002 |
| JP | 2002-350472 A | | 12/2002 |
| JP | 2007-192615 A | | 8/2007 |
| JP | 2009-058294 A | | 3/2009 |
| JP | 2009-58363 A | | 3/2009 |
| JP | 2009-187158 A | | 8/2009 |
| JP | 2012-018037 A | * | 1/2012 |
| WO | WO 2011/077814 A1 | * | 6/2011 |

OTHER PUBLICATIONS

Ge Shaowei, Research on Battery Management System for MH/NI Power Source of Fuel Cell Vehicle, published Aug. 15, 2008, vol. 8, p. 1-70.

Office Action, dated May 27, 2014, issued by the Japanese Patent Office, in counterpart Application No. 2010-154610.

Communication dated Dec. 23, 2014 from the State Intellectual Property Office, P.R. China in counterpart Application No. 201180033631.8.

* cited by examiner

VOLTAGE MEASURING CIRCUIT AND METHOD

CROSS REFERENCE TO RELATED APPLICATIONS

This application is a National Stage of International Application No. PCT/JP2011/065178, filed on Jul. 1, 2011, and claims priority based on Japanese Patent Application No. 2010-154610, Jul. 7, 2010, the contents of all of which are incorporated herein by reference in their entirety.

TECHNICAL FIELD

The present invention relates to a voltage measuring circuit and method that are suitable for measuring voltage between required terminals.

BACKGROUND ART

Typically, a secondary battery in which the amount of energy (electrical power) that is charged and discharged is great is used while maintaining safety by means of, for example, a protective circuit. In particular, a lithium-ion secondary battery has higher energy density than other secondary batteries of the same battery capacity and must therefore be used together with a protective circuit.

The main functions of a protective circuit are over-charge protection and over-discharge protection. Over-charging and over-discharging are normally detected by monitoring the voltage across the terminals (positive terminal and negative terminal) of the secondary battery. As a result, the voltage across the terminals of a secondary battery must be measured accurately to prevent over-charging and over-discharging.

In addition, management of the amount of electrical power accumulated in the secondary battery (hereinbelow referred to as residual battery power) is important when using a secondary battery. The inter-terminal voltage of a secondary battery can be used in the management of residual battery power, and based on the inter-terminal voltage that is measured in the protective circuit, a processor such as a CPU (Central Processing Unit) can estimate the residual battery power from the relation between the inter-terminal voltage and the residual battery power that has been found in advance.

A configuration that employs an operational amplifier is generally known as a circuit for measuring the inter-terminal voltage of a secondary battery of this type (hereinbelow referred to as a voltage measuring circuit). An example of such a circuit is shown in FIG. 1.

The voltage measuring circuit of the background art shown in FIG. 1 is of a configuration in which the inter-terminal voltage of a secondary battery is voltage-divided using a plurality of fixed resistors (resistors in which resistance is fixed) and the voltage-divided voltage is then supplied to a processor by way of an impedance conversion circuit made up by operational amplifier 3. The processor calculates the inter-terminal voltage of the secondary battery based on the output voltage of operational amplifier 3 and the voltage-division ratio realized by the plurality of fixed resistors.

In addition, a configuration, such as described in Patent Document 1, is also known as a circuit that uses an operational amplifier to measure the inter-terminal voltage of a secondary battery. In Patent Document 1, a configuration is described in which the terminal voltages of the positive electrode and negative electrode of a secondary battery are each detected by a respective differential amplifier made up by an operational amplifier and the inter-terminal voltage of the secondary battery is supplied from the differential amplifiers to an A/D (Analog to Digital) converter.

In recent years, secondary batteries are also being used as the power supply of electric automobiles or hybrid automobiles, and further, attendant to the problem of global warming, the use of secondary batteries is being investigated for the storage of electrical power that is generated by a renewable power supply such as solar batteries that are being introduced for the realization of a low-carbon society. In other words, the uses of secondary batteries have expanded with the increase in their capacity, and secondary batteries are coming into use as, for example, the drive apparatus such as a motor that is mounted in an electric automobile or hybrid automobile or the power supply of a stationary apparatus such as an inverter that converts power for enabling supply of electrical power that has been generated by a renewable power supply to an electrical power system.

A drive apparatus or a stationary apparatus becomes the source that generates noise that affects control over a significant amount of electrical power. As a result, the measurement accuracy of the inter-terminal voltage of the secondary battery falls due to this noise. There is the additional concern that the noise generated by the drive apparatus or stationary apparatus may cause malfunctioning of the processor such as a CPU that is incorporated in the protective circuit.

In the voltage measuring circuit of the background art that is shown in FIG. 1, the negative potential of a secondary battery that supplies electrical power to a drive apparatus or stationary apparatus (not shown) that is the source that generates noise shares the ground potential with the processor, whereby the concern arises that the accurate measurement of the inter-terminal voltage of the secondary battery is prevented by the superposition of noise on voltage that has been voltage-divided through the use of a plurality of resistors.

On the other hand, in the voltage measuring circuit described in Patent Document 1, a differential amplifier is used to detect each of the terminal voltages of the positive electrode and negative electrode of the secondary battery, and the common-mode noise generated at the positive electrode and negative electrode of the secondary battery can therefore be prevented. As a result, the effect resulting from noise that is generated in a drive apparatus or stationary apparatus is reduced to a greater degree than the voltage measuring circuit shown in FIG. 1. Nevertheless, noise that is generated as a result of operation of a drive apparatus or stationary apparatus is not limited to only common-mode noise, and the voltage measuring circuit therefore preferably has a configuration which has high resistance to noise.

RELATED ART LITERATURE

Patent Literature

Patent Document 1: Japanese Patent Laid-Open No. 2002-350472

SUMMARY

It is therefore an object of the present invention to provide a voltage measuring circuit and a method that prevents noise emission and enables accurate measurement of voltage across terminals that are the object of measurement.

The voltage measuring circuit of an exemplary aspect of the present invention for achieving the above-described object is a voltage measuring circuit that measures voltage across two terminals of a battery that is the object of measurement, and includes:

a detection resistor that is connected in parallel to the two terminals;

current detection means that measures the current value that flows in the detection resistor;

integration means that subjects the current value that was measured by the current detection means to time quadrature;

average value calculation means that divides the current value that has undergone quadrature (integration) by the integration time to find the average current value that is the average value of the current value; and arithmetic means that calculates the value of voltage across the two terminals from the average current value and the resistance value of the detection resistor.

The voltage measuring method of an exemplary aspect of the present invention is a voltage measuring method for measuring the voltage across two terminal of the object of measurement and includes steps of:

current detection means measuring the current value that flows in a detection resistor that is connected in parallel to the two terminals;

integration means subjecting the current value that was measured by the current detection means to time quadrature;

average value calculation means dividing the current value that was integrated by the integration means by the integration time and finding an average current value that is the average value of the current value;

A/D conversion means converting the average current value that was found by the average value calculation means to a digital signal; and arithmetic means calculating the value of the voltage across the two terminals from the average current value that was converted to a digital signal by the A/D conversion means and the resistance value of the detection resistor.

EXEMPLARY EMBODIMENT

The present invention is next described using the accompanying drawings.

In the voltage measuring circuit of the present exemplary embodiment, the measured values are time-averaged, and the time-averaged value (analog value) is converted to a digital signal and transmitted to a processor. In addition, the ground potential of an analog part that includes the load of, for example, a drive apparatus or stationary apparatus and the ground potential of a digital part that includes the processor are separated.

The average value is calculated by integrating the measured values and then dividing the integrated value by the integration time. In the voltage measuring circuit of the present exemplary embodiment, however, the value of current, which can be treated as a quantity, is subjected to time-quadrature rather than the voltage value. More specifically, a detection resistor, which is a fixed resistor, is connected in parallel to the two terminals that are the object of measurement, the current value that flows in the detection resistor is measured by the current detection means, and the current values are subjected to time-quadrature by the integration means. In addition, the average value of the current (average current value) is found by dividing the current value that has undergone time-quadrature by the average value calculation means by the integration time. The average current value that is found is converted to a digital signal by the A/D conversion means.

In the voltage measuring circuit of the present exemplary embodiment, an insulated communication means is provided that includes a signal insulation element on the transmission path that communicates to the processor the average current value that has undergone A/D conversion, and the ground potential of the analog part that includes the load or secondary battery and the ground potential of the digital part that includes the processor are separated to stabilize the operation of the digital part. The average current value that is transmitted to the processor by way of the insulated communication means is converted by the processor (arithmetic means) to a voltage value based on Ohm's law.

Figure 2:
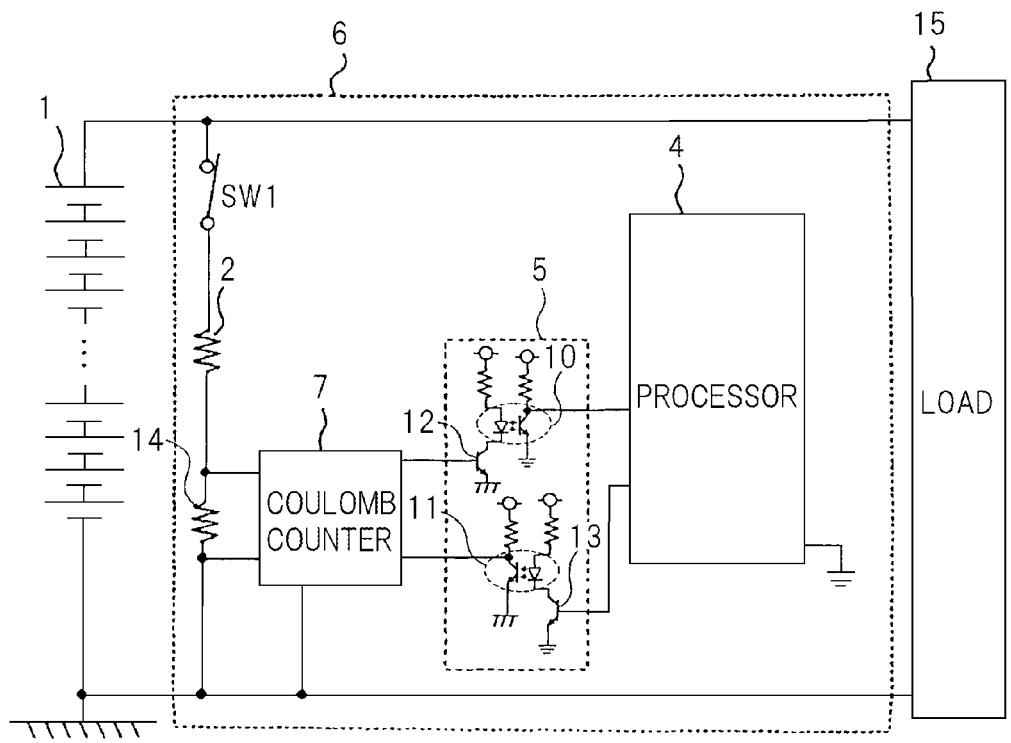
FIG. 2 is a circuit diagram showing an example of the configuration of the voltage measuring circuit of the present invention.

FIG. 2 is a circuit diagram showing an example of the configuration of the voltage measuring circuit of the present invention.

As shown in FIG. 2, the voltage measuring circuit of the present exemplary embodiment is provided with voltage-dividing resistor 2, detection resistor 14, coulomb counter 7, insulated communication circuit 5, and processor 4. Voltage-dividing resistor 2, detection resistor 14, coulomb counter 7, insulated communication circuit 5 and processor 4 are mounted on protective circuit substrate 6 on which is formed, for example, the protective circuit of secondary battery 1. Load 15 that is constituted by a drive apparatus or stationary apparatus is connected across the terminals of secondary battery 1.

In FIG. 2, an example of a configuration is shown in which the inter-terminal voltage of secondary battery 1 is measured by the voltage measuring circuit of the present invention, but the voltage measuring circuit of the present exemplary embodiment is not limited to the measurement of the inter-terminal voltage of secondary battery 1 and can be used when measuring any inter-terminal voltage in another circuit or apparatus. However, it is assumed that the terminals, that are to be measured, have current driving capability that ensures against the occurrence of voltage drop when voltage-dividing resistor 2 or detection resistor 14 is connected.

Voltage-dividing resistor 2 and detection resistor 14 are fixed resistors in which the resistance values are fixed. Voltage-dividing resistor 2 and detection resistor 14 are connected in series and inserted in parallel between the positive electrode terminal and negative electrode terminal of secondary battery 1. Voltage-dividing resistor 2 is used for voltage-dividing the inter-terminal voltage of secondary battery 1 to decrease the voltage that is applied to detection resistor 14. As a result, voltage-dividing resistor 2 is not necessary when a comparatively large resistance value is used in detection resistor 14 or when the inter-terminal voltage of secondary battery 1 is low.

Coulomb counter 7 is provided with the capabilities of the above-described current detection means, integration means, and average value calculation means, detects the difference in potential (voltage) that occurs at the two ends of detection resistor 14 as the current value that flows in detection resistor 14, and both subjects this value to time-quadrature and calculates the average value of the current (average current value) by dividing the integrated value by the integration time. Coulomb counter 7 is further provided with the capability of the above-described A/D conversion means and A/D converts and supplies as a digital signal the average value of the current that was calculated. Coulomb counter 7 and processor 4 have a configuration that allows bidirectional communication of signals by, for example, a serial communication method.

Normally, coulomb counter 7 detects the charge/discharge current to secondary battery 1 by measuring the potential difference (voltage) that occurs at the two ends of the detection resistor that is inserted in series between load 15 and a terminal (positive electrode or negative electrode) of secondary battery 1 and adds up the charge/discharge current that is detected to estimate the battery residual amount of secondary battery 1. In the present exemplary embodiment, this coulomb counter 7 is used in the measurement of the inter-terminal voltage of secondary battery 1. Coulomb counter 7 can be realized by using, for example, battery monitor appraisal module bq26200 of the U.S. company Texas Instruments. Details regarding battery monitoring appraisal module bq26200 are described on the Internet, reference: URL:// focus.tij.co.jp/jp/docs/prod/folders/print/bq26200.html.

Although an example is shown in FIG. 2 in which coulomb counter 7 measures the current value, subjects this current value to time-quadrature, and further, finds the current average value from the value that was subjected to time-quadrature, the process for time-quadrature or for finding the current average value can be realized by processor 4. In such cases, coulomb counter 7 may subject the current value that was measured to A/D conversion and supply the value to processor 4.

Insulated communication circuit 5 is provided with photocouplers 10 and 11, which are signal insulation elements, and transistors 12 and 13; whereby the bidirectional communication of processor 4 and coulomb counter 7 is thus enabled while photocouplers 10 and 11 separate the ground potential of processor 4 and the ground potential of coulomb counter 7. The above-described current average value (digital signal) is supplied from coulomb counter 7 to processor 4 as described above. On the other hand, commands (digital signals) for controlling the operation of coulomb counter 7 are supplied from processor 4 to coulomb counter 7. When coulomb counter 7 operates independently without being controlled from processor 4, photocoupler 11 and transistor 13 that relay commands transmitted from processor 4 to coulomb counter 7 are not necessary.

Transistor 12 drives photocoupler 10 in accordance with the current average value (digital signal) that is supplied from coulomb counter 7, and transistor 13 drives photocoupler 11 in accordance with commands (digital signals) that are supplied from processor 4.

Insulated communication circuit 5 is not limited to a configuration that uses photocoupling signal insulation elements such as photocouplers 10 and 11 shown in FIG. 2 and may be configured using signal insulation elements of a magnetic coupling type or a capacitive coupling type.

Processor 4 calculates the inter-terminal voltage of secondary battery 1 based on the current value that is reported from coulomb counter 7 as well as on the resistance values of voltage-dividing resistor 2 and detection resistor 14 in accordance with a program that is stored in, for example, a storage device (not shown). Processor 4 may be provided with, for example, a storage device or a control device that is composed of various logic circuits. A processor that is incorporated into, for example, the protective circuit of secondary battery 1 may be employed as processor 4.

In a configuration of this type, the inter-terminal voltage of secondary battery 1 is voltage-divided by voltage-dividing resistor 2 and detection resistor 14.

Coulomb counter 7 detects in the difference in potential (voltage) that is produced at the two ends of detection resistor 14 as the current value that flows in detection resistor 14 and calculates the average current value by both subjecting the current value to time-quadrature and dividing the integrated value by the integration time.

Coulomb counter 7 further converts the average current value to a digital signal and communicates the signal to processor 4 by way of insulated communication circuit 5 and by means of a serial communication method.

Processor 4 calculates the inter-terminal voltage of secondary battery 1 from the average current value that was received from insulated communication circuit 5 as well as the resistance values of voltage-dividing resistor 2 and detection resistor 14 based on Ohm's law. The inter-terminal voltage of secondary battery 1 can be measured by this series of processes.

The voltage measuring circuit of the present exemplary embodiment has a configuration that measures the current value that flows in a detection resistor, subjects the current value to time-quadrature, finds the average current value by dividing the current value that has undergone time-quadrature by the integration time, and converts the average current value to a voltage value, whereby, despite the occurrence of noise generated in load 15 at the two ends of detection resistor 14, this noise can be reduced by averaging. As a result, noise emission can be prevented to enable the accurate measurement of the voltage across the terminals that are the object of measurement.

In addition, insulated communication circuit 5 separates the ground potential of an analog part that includes load 15 or coulomb counter 7 and the ground potential of a digital part that includes processor 4 while enabling bidirectional communication between coulomb counter 7 and processor 4, whereby the adverse influence upon the digital part caused by noise that is generated by load 15 is decreased.

As a result, stabilized voltage measurement can be realized by reducing noise emission that is generated in a load such as a drive apparatus or stationary apparatus. In addition, malfunctioning of a digital part that includes processor 4 is prevented by separating the ground potential of an analog part that includes secondary battery 1 and the ground potential of the digital part that includes processor 4.

Typically, when the inter-terminal voltage of secondary battery 1 is measured, the voltage measuring circuit for this measurement is also operated by electrical power that is supplied from the secondary battery, and the voltage measuring circuit therefore preferably has a circuit configuration that consumes the least possible amount of electrical power.

As described hereinabove, coulomb counter 7 is originally an element used in the detection of the charge/discharge current of secondary battery 1 and is designed to operate at a low power consumption that is taken into consideration in the protective circuit of secondary battery 1. As a result, the use of coulomb counter 7 as the above-described current detection means, integration means, average value calculation means, and A/D conversion means in the voltage measuring circuit of the present exemplary embodiment enables preventing an increase in the power consumption of the voltage measuring circuit.

As shown in FIG. 2, switch SW1 is provided between the positive electrode of secondary battery 1 and voltage-dividing resistor 2, and a further reduction of power consumption can be realized during the standby of the voltage measuring circuit if control is effected by, for example, the instructions of processor 4 to cut the contacts of this switch SW1 during standby in which voltage measurement is not implemented. Switch SW1 may also be provided between the negative electrode of secondary battery 1 and detection resistor 14.

Figure 1:
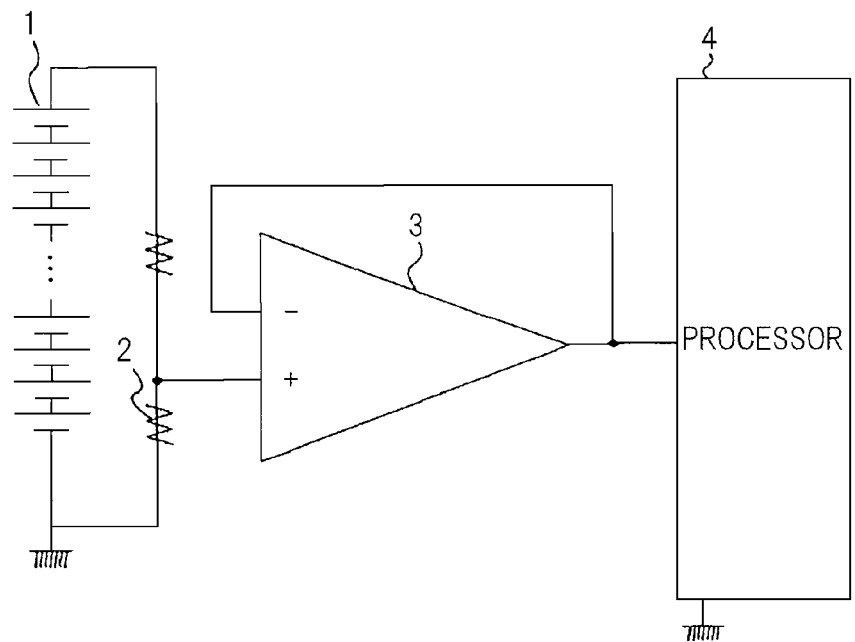
FIG. 1 is a circuit diagram showing the configuration of a voltage measuring circuit of the background art.

For the purpose of obtaining a higher output voltage in which a plurality of secondary batteries connected in a series is used to obtain higher output voltage, the adoption of a configuration that employs operational amplifier 3 shown in FIG. 1 or a configuration in which the inter-terminal voltage of a secondary battery is applied to a semiconductor device necessitates selection of circuit components of the voltage measuring circuit that takes into consideration the maximum voltage rating value of operational amplifier 3 or semiconductor device. The voltage measuring circuit of the present exemplary embodiment has a configuration in which fixed resistor 2 and detection resistor 14 are connected between the terminals of secondary battery 1, and the maximum rated value of the power consumption of fixed resistor 2 or detection resistor 14 must be taken into consideration. However, because a configuration is not employed in which the inter-terminal voltage of secondary battery 1 is applied to an operational amplifier or semiconductor device, there is no need to consider the maximum voltage rated value of the circuit components, and the degree of freedom of selection of circuit components is therefore improved.

Although the invention of the present application has been described with reference to an exemplary embodiment, the invention of the present application is not limited to the above-described exemplary embodiment. The configuration and details of the invention of the present application are open to various modifications within the scope of the invention of the present application that will be clear to one of ordinary skill in the art.

This application claims the benefits of priority based on Japanese Patent Application No. 2010-154610 for which application was submitted on Jul. 7, 2010 and incorporates by citation all of the disclosures of these applications.

What is claimed is:

1. A voltage measuring circuit that measures voltage across two terminals of a battery that is the object of measurement, comprising:
   a detection resistor that is connected in parallel to said two terminals;
   current detection means that measures current value that flows in said detection resistor;
   integration means that subjects said current value that was measured by said current detection means to time quadrature;
   average value calculation means that divides the current value that has undergone integration by the integration time to find the average current value that is the average value of said current value; and
   arithmetic means that calculates the value of voltage across said two terminals from said average current value and the resistance value of said detection resistor.

2. The voltage measuring circuit according to claim 1, further comprising:
   a switch that is connected between said detection resistor and one of said terminals;
   wherein said arithmetic means turns OFF said switch during standby during which voltage measurement is not implemented.

3. The voltage measuring circuit according to claim 1, wherein said battery that is the object of measurement is a secondary battery.

4. The voltage measuring circuit according to claim 1, further comprising:
   A/D conversion means that converts said average current value to a digital signal;
   wherein said arithmetic means calculates the value of voltage across said two terminals from said average current value that was converted to a digital signal in said A/D conversion means and said resistance value.

5. The voltage measuring circuit according to claim 4, further comprising insulated communication means that both separates the ground potential of said current detection means, said integration means, said average value calculation means, and said A/D conversion means and the ground potential of said arithmetic means and connects said A/D conversion means and said arithmetic means to enable transmission of said average current value that was converted to said digital signal.

6. The voltage measuring circuit according to claim 4, wherein said current detection means, said integration means, said average value calculation means, and said A/D conversion means are realized by a coulomb counter.

7. A voltage measuring method for measuring voltage across two terminals of a battery that is the object of measurement, said voltage measuring method comprising steps of:
   current detection means measuring a current value that flows in a detection resistor that is connected in parallel to said two terminals;
   integration means subjecting said current value that was measured by said current detection means to time-quadrature;
   average value calculation means dividing the current value that was integrated by said integration means by the integration time and finding an average current value that is the average value of said current value;
   arithmetic means calculating the value of voltage across said two terminals from said average current value and the resistance value of said detection resistor.

8. The voltage measuring method according to claim 7, wherein:
   a switch is provided between said detection resistor and either one of said terminals; and
   said arithmetic means turns OFF said switch during standby during which voltage measurement is not implemented.

9. The voltage measuring method according to claim 7, wherein said battery that is the object of measurement is a secondary battery.

10. The voltage measuring method according to claim 7, wherein:
    A/D conversion means converts said average current value that was found in said average value calculation means to a digital signal; and
    said arithmetic means calculates the value of voltage across said two terminals from said average current value that was converted to a digital signal in said A/D conversion means and said resistance value.

11. The voltage measuring method according to claim 10, wherein an insulated communication means both separates the ground potential of said current detection means, said integration means, said average value calculation means, and said A/D conversion means and the ground potential of said arithmetic means and connects said AD conversion means and said arithmetic means to enable transmission of said average current value that was converted to said digital signal.

12. The voltage measuring method according to claim 10, wherein said current detection means, said integration means, said average value calculation means, and said A/D conversion means are realized by a coulomb counter.

* * * * *